(12) United States Patent
Zeng et al.

(10) Patent No.: US 12,360,517 B2
(45) Date of Patent: Jul. 15, 2025

(54) DATA PROCESSING METHODS AND SYSTEMS, AND COMPUTER-READABLE STORAGE MEDIA

(71) Applicants: Mianyang BOE Optoelectronics Technology Co., Ltd., Sichuan (CN); BOE Technology Group Co., Ltd., Beijing (CN)

(72) Inventors: Jianfeng Zeng, Beijing (CN); Liandong Dou, Beijing (CN); Zihan Tang, Beijing (CN)

(73) Assignees: Mianyang BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/915,733

(22) PCT Filed: Sep. 30, 2021

(86) PCT No.: PCT/CN2021/122098
§ 371 (c)(1),
(2) Date: Sep. 29, 2022

(87) PCT Pub. No.: WO2023/050275
PCT Pub. Date: Apr. 6, 2023

(65) Prior Publication Data
US 2024/0210928 A1 Jun. 27, 2024

(51) Int. Cl.
*G05B 19/418* (2006.01)
(52) U.S. Cl.
CPC .............. *G05B 19/41875* (2013.01); *G05B 2219/32368* (2013.01)
(58) Field of Classification Search
None
See application file for complete search history.

(56) References Cited

U.S. PATENT DOCUMENTS 5,982,920 A * 11/1999 Tobin, Jr. .............. G06T 7/0004
382/145
5,991,699 A * 11/1999 Kulkarni ................. H01L 22/20
700/121
(Continued)

FOREIGN PATENT DOCUMENTS

CN 102615422 A 8/2012
CN 103280414 A 9/2013
(Continued)

OTHER PUBLICATIONS

PCT/CN2021/122098 international search report.
(Continued)

*Primary Examiner* — Jason Lin
(74) *Attorney, Agent, or Firm* — IPro, PLLC

(57) ABSTRACT

A data processing method and system, and a computer-readable storage medium. The method includes: acquiring target data, the target data including data from a plurality of analysis units (21); acquiring, from each of the analysis units, inspection data of a plurality of substrates to be inspected that contain defect points (22); superimposing the defect points in the plurality of substrates to be inspected to obtain a data set of the defect points (23); performing a clustering calculation on the data set of the defect points to obtain a first cluster set of the defect points (24); and generating, based on the first cluster set of the defect points, alarm information for a device contact position corresponding to the first cluster set (25). With the method, the substrates to be inspected in each analysis unit are analyzed, and a time interval between the process of production and the process of analysis of repeated defects is shortened, which is conducive to improving the data processing efficiency. Moreover, with the method, it is possible to detect the defect points that are repeatedly defective at the same position, i.e., to obtain the first cluster set of the defect (Continued)

points, so as to achieve the effect of timely inspection of the repeated defects caused by the production device, which is conducive to improving a production yield of the substrates to be inspected.

16 Claims, 7 Drawing Sheets

(56) References Cited

U.S. PATENT DOCUMENTS

| | | | | |
|---|---|---|---|---|
| 6,876,445 B2* | 4/2005 | Shibuya | ............... | G06T 7/001 |
| | | | | 382/145 |
| 6,882,896 B2* | 4/2005 | Ting | ............... | G06T 7/0006 |
| | | | | 700/121 |
| 6,999,835 B2* | 2/2006 | Kodama | ............... | G05B 23/0289 |
| | | | | 700/121 |
| 7,072,786 B2* | 7/2006 | Coldren | ............... | G05B 19/41875 |
| | | | | 382/145 |
| 7,570,797 B1* | 8/2009 | Wang | ............... | G06F 18/40 |
| | | | | 356/237.4 |
| 7,623,698 B2* | 11/2009 | Soenksen | ............... | G06T 7/0004 |
| | | | | 715/837 |
| 7,813,539 B2* | 10/2010 | Shibuya | ............... | G06T 7/0004 |
| | | | | 382/141 |
| 8,081,814 B2* | 12/2011 | Matsushita | ............... | G06T 7/0004 |
| | | | | 382/141 |
| 8,948,494 B2* | 2/2015 | Plihal | ............... | G06T 7/0008 |
| | | | | 382/148 |
| 9,613,255 B2* | 4/2017 | Amzaleg | ............... | G06V 40/33 |
| 2002/0052053 A1* | 5/2002 | Ono | ............... | G01N 21/9501 |
| | | | | 257/E21.525 |
| 2002/0145112 A1* | 10/2002 | Davidson | ............... | G01N 23/225 |
| | | | | 250/307 |
| 2003/0109952 A1* | 6/2003 | Hosoya | ............... | G06T 7/0002 |
| | | | | 700/110 |
| 2004/0036863 A1* | 2/2004 | Matsusita | ............... | H01L 22/20 |
| | | | | 257/E21.525 |
| 2006/0012782 A1* | 1/2006 | Lim | ............... | G01N 21/95607 |
| | | | | 356/237.5 |
| 2007/0285653 A1* | 12/2007 | Takahashi | ............... | G01N 21/95607 |
| | | | | 356/237.2 |
| 2012/0109660 A1 | 5/2012 | Xu et al. | | |
| 2015/0310448 A1 | 10/2015 | Vilain et al. | | |
| 2017/0263104 A1 | 9/2017 | Yan et al. | | |
| 2020/0191830 A1* | 6/2020 | Watanabe | ............... | G01R 1/07364 |
| 2022/0405909 A1* | 12/2022 | Wang | ............... | G06T 7/50 |

FOREIGN PATENT DOCUMENTS

| | | |
|---|---|---|
| CN | 105807742 A | 7/2016 |
| CN | 109086291 A | 12/2018 |
| CN | 109711437 A | 5/2019 |
| CN | 110276410 A | 9/2019 |
| CN | 112184691 A | 1/2021 |
| JP | 2009070834 A | 4/2009 |
| WO | 2021142622 A1 | 7/2021 |

OTHER PUBLICATIONS

Huang Qian, et al, "Automatic recognition of bolts on locomotive running gear based on laser scanner 3D measurement", Opto-Electronic Engineering, DOI: 10.12086/oee.2018.170532.

Zhu Lian, et al. "The Gas User Monitoring System", Management anti Administration, doi:10.3969/j.issn.1671-5152.2019.10.007.

Maozhen Li, et al. "Parallelizing Hartle transform with Hadoop for fast detection of glass defects", Concurrency and Computation Practice and Experience, Mar. 4, 2018, DOI: 10.1002/cpe.4499.

* cited by examiner

FIG.10

BP Common Defect Monitoring

Film : GAT1_FI_NI:
[ ( -142.416,825.215 ) ]clustered on five Glass,
Predictions focus on [A2302ON: ( BATSP05-SPUT-LL01, BATSP10-SPUT-PC04 ) ]:
Glass : B66F130093:B8,B9,C1,C3,C4

[ ( -281.231,-341.822 ) , ( 628.76,583.103 ) ]clustered on four Glass,
Predictions focus on[A2700ON: ( BAEWS06 ) ]:
Glass : B66F130077:B5,BX,C1,B68A130148:A1

NOTE! Data chain: [20210707111244402484]

FIG.11

DATA PROCESSING METHODS AND SYSTEMS, AND COMPUTER-READABLE STORAGE MEDIA

CROSS-REFERENCE TO RELATED APPLICATIONS

This disclosure is the U.S. national phase of PCT Application No. PCT/CN2021/122098 filed on Sep. 30, 2021, which is incorporated herein by reference in its entirety.

TECHNICAL FIELD

The present disclosure relates to the field of data processing technology, and in particular to a data processing method and system, and a computer-readable storage medium.

BACKGROUND

At present, in the process of producing display panels, substrates to be inspected (GLASS) may be inspected by automated optical inspection (AOI) to detect process defects. For example, factors such as improper contact points of a device and particles on a mask may cause repeated defects in the same coordinate position of the substrates to be inspected passing through the same process station, reducing a yield.

SUMMARY

The present disclosure provides a data processing method and system, and a computer-readable storage medium, in order to solve the deficiencies in the related art.

According to a first aspect of embodiments of the present disclosure, there is provided a data processing method, including:
  acquiring target data;
  acquiring, from the target data, inspection data of a plurality of substrates to be inspected that contain defect points;
  superimposing the defect points in the plurality of substrates to be inspected to obtain a data set of the defect points;
  performing a clustering calculation on the data set of the defect points to obtain a first cluster set of the defect points; and
  generating, based on the first cluster set of the defect points, alarm information for a device contact position corresponding to the first cluster set.

Optionally, acquiring the target data includes:
  obtaining a sorting result for the substrates to be inspected by sorting the substrates to be inspected passing through each production device according to a production time based on production data in source data;
  obtaining a plurality of units by distributing a preset number of the substrates to be inspected into a same unit in sequence based on the sorting result;
  acquiring, based on inspection data in the source data, the number of the substrates to be inspected in each unit that pass through an inspection station; and
  acquiring an arrival rate for the substrates to be inspected in each unit, and using data of the unit that the arrival rate exceeds a preset arrival rate threshold as the target data transformed.

Optionally, performing the clustering calculation on the data set of the defect points to obtain the first cluster set of the defect points includes:
  obtaining an initial cluster of the defect points by acquiring a number m of defect points within an area formed by taking any defect point Pi in the data set as a reference point and r as a distance threshold;
  obtaining a plurality of initial clusters of the defect points by traversing the defect points in the data set; and
  obtaining the first cluster set of the defect points by acquiring multiple of the initial clusters that satisfy a condition that the number m of the defect points in the initial cluster is greater than or equal to a first threshold.

Optionally, generating, based on the first cluster set of the defect points, the alarm information for the device contact position corresponding to the first cluster set, includes:
  obtaining a second cluster set of the defect points by filtering, from a plurality of first cluster sets of the defect points, one or more first clusters of the defect points with the same position information; and
  generating, based on the second cluster set of the defect points, the alarm information for the device contact position corresponding to the second cluster set.

Optionally, filtering, from the plurality of first cluster sets of the defect points, the one or more first clusters of the defect points with the same position information, includes:
  for each of the first cluster sets of the defect points, acquiring the number of the defect points in each point cluster in the first cluster set;
  sorting point clusters in the first cluster set according to the number;
  acquiring the point cluster with the most defect points in the first cluster set as a candidate point cluster;
  acquiring an intersection-over-union between any point cluster in the first cluster set and the candidate point cluster, and removing, from the first cluster set, one or more point clusters with the intersection-over-union exceeding a preset intersection-over-union threshold;
  moving the candidate point cluster from the first cluster set into a preset second cluster set of the defect points; and
  if the first cluster set is a non-empty set, continuing step of acquiring the point cluster with the most defect points in the first cluster set as the candidate point cluster;
  otherwise, determining to obtain the second cluster set of the defect points.

Optionally, the method further includes:
  controlling a corresponding production device according to the device contact position to allow the production device to perform a protective action.

Optionally, the device contact position includes at least one of: coordinates of the defect point, an identification code of the substrate to be inspected, or an identification code of a production device.

According to a second aspect of embodiments of the present disclosure, there is provided a data processing method, including:
  acquiring, in response to an operation of subscribing to a monitoring function, a preset value of at least one subscription parameter associated with an inspection of defect points;
  acquiring target data based on the preset value, and processing the target data to obtain a first cluster set of the defect points; and
  generating, based on the first cluster set of the defect points, alarm information for a device contact position corresponding to the first cluster set.

According to a third aspect of embodiments of the present disclosure, there is provided a data processing system, including:

a distributed storage apparatus configured to store source data;

a data extraction, transformation and loading ETL apparatus including one or more first processors, which are configured to transform the source data into target data; and a data processing apparatus including one or more second processors, which are configured to: acquire, from the target data, inspection data of a plurality of substrates to be inspected that contain defect points; superimpose the defect points in the plurality of substrates to be inspected to obtain a data set of the defect points; perform a clustering calculation on the data set of the defect points to obtain a first cluster set of the defect points; and generate, based on the first cluster set of the defect points, alarm information for a device contact position corresponding to the first cluster set.

Optionally, the source data includes at least one of metadata, production data, or inspection data, the metadata represents an association between a process station and an inspection station, the production data represents production history data of each of the substrates to be inspected, and the inspection data includes data generated when the substrate to be inspected is inspected in the inspection station.

Optionally, the one or more second processors are further configured to:

obtain a sorting result for the substrates to be inspected by sorting the substrates to be inspected passing through each production device according to a production time based on production data in the source data;

obtain a plurality of units by distributing a preset number of the substrates to be inspected into a same unit in sequence based on the sorting result;

acquire, based on inspection data in the source data, the number of the substrates to be inspected in each unit that pass through an inspection station; and acquire an arrival rate for the substrates to be inspected in each unit, and use data of the unit that the arrival rate exceeds a preset arrival rate threshold as the target data transformed.

Optionally, when performing the clustering calculation on the data set of the defect points to obtain the first cluster set of the defect points, the one or more second processors are further configured to:

obtain an initial cluster of the defect points by acquiring a number m of defect points within an area formed by taking any defect point Pi in the data set as a reference point and r as a distance threshold;

obtain a plurality of initial clusters of the defect points by traversing the defect points in the data set; and obtain the first cluster set of the defect points by acquiring multiple of the initial clusters that satisfy a condition that the number m of the defect points in the initial cluster is greater than or equal to a first threshold.

Optionally, when generating, based on the first cluster set of the defect points, the alarm information for the device contact position corresponding to the first cluster set, the one or more second processors are further configured to:

obtain a second cluster set of the defect points by filtering, from a plurality of first cluster sets of the defect points, one or more first clusters of the defect points with the same position information; and generate, based on the second cluster set of the defect points, the alarm information for the device contact position corresponding to the second cluster set.

Optionally, when filtering, from the plurality of first cluster sets of the defect points, the one or more first clusters of the defect points with the same position information, the one or more second processors are further configured to:

for each of the first cluster sets of the defect points, acquire the number of the defect points in each point cluster in the first cluster set;

sort point clusters in the first cluster set according to the number;

acquire the point cluster with the most defect points in the first cluster set as a candidate point cluster;

acquire an intersection-over-union between any point cluster in the first cluster set and the candidate point cluster, and remove, from the first cluster set, one or more point clusters with the intersection-over-union exceeding a preset intersection-over-union threshold;

move the candidate point cluster from the first cluster set into a preset second cluster set of the defect points; and if the first cluster set is a non-empty set, continue step of acquiring the point cluster with the most defect points in the first cluster set as the candidate point cluster; otherwise, determine to obtain the second cluster set of the defect points.

Optionally, the one or more second processors are further configured to:

control a corresponding production device according to the device contact position to allow the production device to perform a protective action.

Optionally, the device contact position includes at least one of: coordinates of the defect point, an identification code of the substrate to be inspected, or an identification code of a production device.

Optionally, the data processing system further includes a display apparatus, the display apparatus including at least one display screen, which is configured to display the alarm information.

According to a fourth aspect of embodiments of the present disclosure, there is provided a computer-readable storage medium. When an executable computer program in the storage medium is executed by a processor, the above method can be implemented.

The technical solutions according to embodiments of the present disclosure can provide the following beneficial effects.

With the embodiments of the present disclosure as described above, target data is acquired; inspection data of a plurality of substrates to be inspected that contain defect points is acquired from each analysis unit; the defect points in the plurality of substrates to be inspected are then superimposed to obtain a data set of the defect points; after that, a clustering calculation is performed on the data set of the defect points to obtain a first cluster set of the defect points; and alarm information for a device contact position corresponding to the first cluster set of the defect points is finally generated based on the first cluster set. In this way, by dividing the substrates to be inspected that are produced by the same production device to form analysis units, and then analyzing the substrates to be inspected in each analysis unit, a time interval between the process of production and the process of analysis of repeated defects is shortened, which is conducive to improving the data processing efficiency. Moreover, in the present disclosure, by superimposing the defect points in the plurality of substrates to be inspected, it is possible to detect the defect points that are repeatedly defective at the same position, i.e., to obtain the first cluster set of the defect points, so as to achieve the effect of timely inspection of the repeated defects caused by the production device, which is conducive to improving a production yield of the substrates to be inspected.

It should be understood that the foregoing general description and the following detailed description are exemplary and explanatory only, and are not intended to limit the present disclosure.

BRIEF DESCRIPTION OF THE DRAWINGS

The accompanying drawings herein, which are incorporated into and constitute a part of this specification, illustrate embodiments consistent with the present disclosure, and serve to explain the principles of the present disclosure together with the specification.

FIG. 8 (*b*) is a schematic diagram illustrating an effect that a second point cluster set includes three point clusters according to an exemplary embodiment.

FIG. 10 is a schematic diagram illustrating an effect of a function subscription interface according to an exemplary embodiment.

FIG. 11 is a schematic diagram illustrating an effect of an alarm interface according to an exemplary embodiment.

DETAILED DESCRIPTION OF THE EMBODIMENTS

Figure 1:
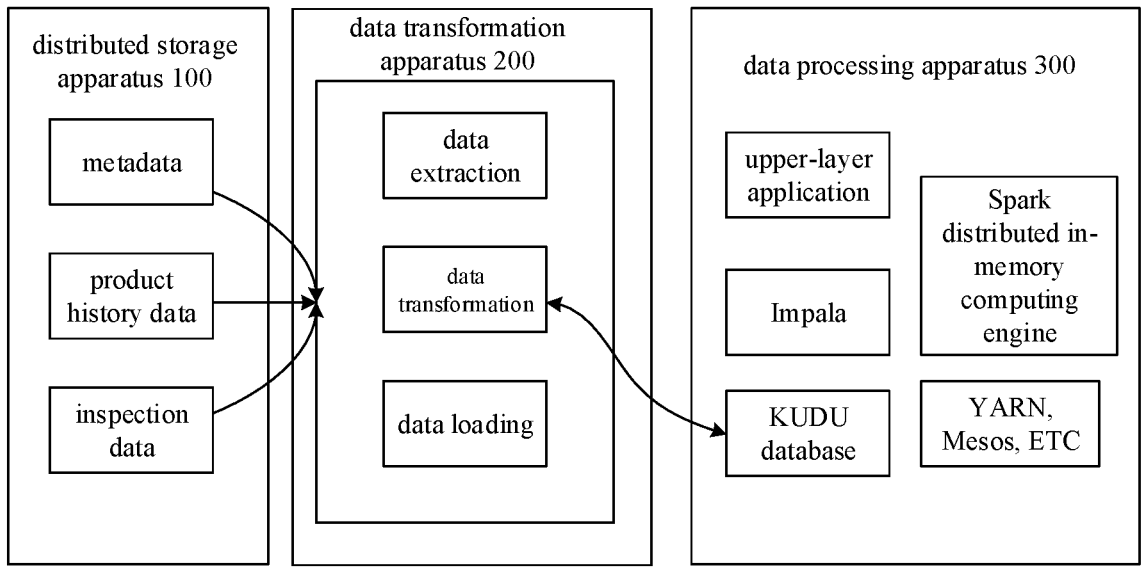
FIG. 1 is a block diagram illustrating a data processing system according to an exemplary embodiment.

Exemplary embodiments will be described herein in detail, examples of which are illustrated in the drawings. When the following description involves the drawings, like numerals in different drawings refer to like or similar elements unless otherwise indicated. Embodiments described in the following exemplary embodiments do not represent all embodiments consistent with the present disclosure. Rather, they are merely examples of apparatuses consistent with some aspects of the present disclosure as detailed in the appended claims.

At present, a production line of an industrial product includes several production devices, and each production device may affect a product yield in case of abnormal operation or abnormal operating parameters. When a defect product is produced, production personnel need to position the cause of the defect product. However, a mass of data is generated by the production devices in the production line, while the use of traditional relational databases for data storage and analysis has the following problems: slow reading and writing, high cost, limited storage capacity, and difficulty in expansion, and these inherent shortcomings increase the time cost of use of the database and the hardware cost. Meanwhile, the production is non-stop, and the data is continuously generated, which further increases the complexity of monitoring and positioning generation of defect products and analyzing the causes of production defects, resulting in a drop in productivity and a large consumption of manpower and consumables in the production line. Since multiple production devices in multiple factories are involved, the amount of raw data is huge. For example, all production devices may generate hundreds of gigabytes of raw data per day, or tens of gigabytes per hour.

Embodiments of the present disclosure provide a data processing system, also referred to in subsequent embodiments as the system of the present disclosure or this system or the system. As shown in FIG. 1, the data processing system includes a distributed storage apparatus 100, a data transformation apparatus 200, and a data processing apparatus 300. The data transformation apparatus 200 is connected with the distributed storage apparatus 100 and the data processing apparatus 300, respectively. The data processing system adopts a new process in this solution, which can effectively reduce the cost of database management and use, as well as improve the efficiency of finding the causes of defect products, thereby improving production efficiency.

The distributed storage apparatus 100 may include a source database capable of processing raw data generated by a production device, for example, a relational database (such as Oracle and Mysql) including YMS (Yield Management System), FDC (Fault Detection & Classification), MES (Manufacturing Execution System) and other systems, and be configured to store the raw data generated by a plurality of production devices.

For example, the raw data generated by the plurality of production devices includes production data. The production data includes information on the production device through which a plurality of samples (e.g., substrates to be inspected) pass during the production process and information on types of defects that occur. Each sample goes through multiple of the production devices during the production process, and each production device participates and only participates in the production process for some of the plurality of samples. For ease of illustration, the sample in the present disclosure may be the substrate to be inspected (GLASS), and solutions may be described in the subsequent embodiments by taking the substrate to be inspected as an example.

The distributed storage apparatus 100 has relatively complete data stored therein. The distributed storage apparatus may include a plurality of hardware memories, and different hardware memories are distributed in different physical locations (e.g., in different factories, or in different production lines), and transmit information to each other through wireless transmission (such as network) or by wire, such that the data is distributed relational, but logically constitutes a database based on big data technology.

The data in the distributed storage apparatus 100 may be stored using Hive tool or in Hbase database format. For example, according to the Hive tool, the above raw data is first stored in a data lake; after that, pre-processing such as data cleansing and data transformation may be continued in the Hive tool according to application topics and scenarios of the data to obtain data warehouses with different topics (e.g., production history topics, inspection data topics, device data topics, and metadata topics) and data sets with different scenarios (e.g., device analysis scenarios, and parameter analysis scenarios). The above data sets may then be connected to display devices, analysis devices, etc. through different API interfaces to enable data interaction with these devices.

In an embodiment, a solution to implement storage and computing for massive structured data is a big data solution based on a distributed file system (DFS).

DFS-based big data technology allows construction of large clusters using multiple inexpensive hardware devices to process massive data. For example, the Hive tool is a Hadoop-based data warehouse tool that may be used for data extraction, transformation and loading (ETL). The Hive tool defines a simple SQL-like query language, and also allows complex analysis tasks that cannot be done by default tools through custom MapReduce mappers and reducers. The Hive tool does not have a specialized data storage format, nor does it build indexes for the data. Users may freely organize tables in the Hive tool and work with the data in the database. It can be seen that the parallel processing of distributed file management may meet the storage and processing requirements for massive data. Users may process simple data through SQL query, while custom functions may be used for complex processing. Therefore, when analyzing the massive data of the factory, it is necessary to extract the data in the factory database into the distributed file system, which may not cause damage to the raw data on the one hand, and may improve the efficiency of data analysis on the other hand.

In an embodiment, the distributed storage apparatus 100 may be a general designation of a memory, a plurality of memories, or a plurality of storage elements. For example, the memory may include random access memory (RAM), double data rate synchronous dynamic random access memory (DDR SDRAM), or non-volatile memory such as disk storage, flash, etc.

The data transformation apparatus 200 may include one or more processors, which are hereinafter referred to as first processors for distinction. The data transformation apparatus 200 may communicate with the distributed storage apparatus 100 to obtain source data. For example, the data transformation apparatus may extract the source data from a distributed database using an ETL data extraction tool (e.g., Pentaho, Sqoop, kettle, etc.) to transform the source data into target data.

The data processing apparatus 300 may include one or more processors, which are hereinafter referred to as second processors for distinction. The data processing apparatus 300 is configured to implement a data processing method according to any one of the following embodiments. For specific implementation, reference may be made to the solution of a data processing method in subsequent embodiments, which will not be described herein.

In an embodiment, the data processing system further includes a display apparatus (not shown in the drawings). The display apparatus is configured to display an interface, which may include data such as alarm information that may be displayed for the data processing apparatus 300. In an embodiment, the display apparatus may be a touch display, or may be a product including a display, such as a TV set, a computer (an all-in-one computer or a desktop computer), a tablet computer, a mobile phone, an electronic painting screen, and the like.

Figure 2:
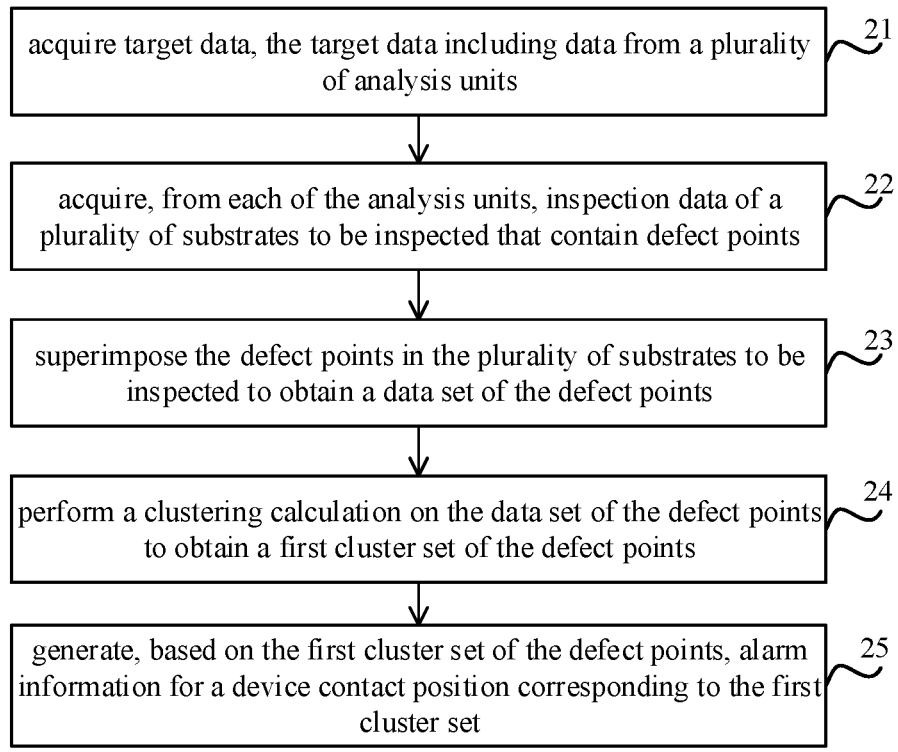
FIG. 2 is a flowchart illustrating a data processing method according to an exemplary embodiment.

FIG. 2 is a flowchart illustrating a data processing method according to an exemplary embodiment that is applicable to the data processing system shown in FIG. 1. Referring to FIG. 2, a data processing method includes step 21 to step 24.

At step 21, target data is acquired, where the target data includes data from a plurality of analysis units. Here, "a plurality of analysis units" means distributing a preset number of substrates to be inspected (which will be described below) into the same unit to obtain a plurality of units for analysis of the substrates to be inspected in each unit.

Figure 3:
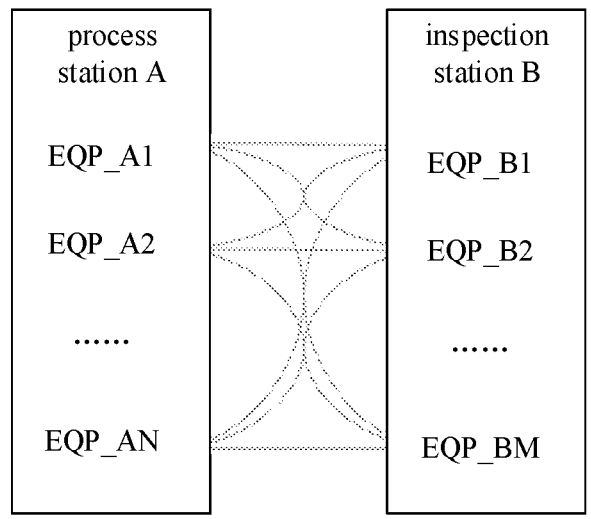
FIG. 3 is a schematic diagram illustrating an association between a process station and an inspection station according to an exemplary embodiment.

In this embodiment, the data transformation apparatus 200 in this system may communicate with the distributed storage apparatus 100 to acquire the source data stored in the distributed storage apparatus. The source data may include at least one of metadata, production data, or inspection data, and the acquired source data may be selected according to specific scenarios, which is not limited herein. The metadata represents an association between a process station and an inspection station, with the effect shown in FIG. 3, that is, the metadata may be used to identify an inspection device responsible for inspecting a production device. In practical applications, the metadata may also represent a production device hierarchy (EQP, MACHINE, and UNIT) for defect calculations and subsequent alarms. In practical applications, the above metadata is generated by the production device, production line or data processing system according to the production device that the substrate to be inspected passes through and relevant parameters to be inspected for the substrate to be inspected when the production work order is imported into the production line, or the metadata is preset and stored, which may be set according to specific scenarios and is not limited herein.

The above production data represents data generated when each substrate to be inspected passes through each production device, and is often referred to as production history data, such as deposition of ITO film, coating of photoresist, etching, stripping, etc. The production data includes an identification code (GLASSID) of the substrate to be inspected, an identification code of the production device, time for the substrate to be inspected to enter and leave the production device, etc.

The above inspection data includes data generated when the substrate to be inspected is inspected in the inspection station, such as inspection time, the identification code of the substrate to be inspected, an identification code of the process station, a defect code, coordinates of a defect point, etc.

In this embodiment, the above-mentioned data transformation apparatus 200 may transform the source data into the target data, or generate the target data required by the data processing apparatus 300 in this system by loading the source data in the source database for cleansing and transformation, and upload the target data to a database of the data processing apparatus 300. And, the database of the data processing apparatus may be implemented by KUDU database.

Figure 4:
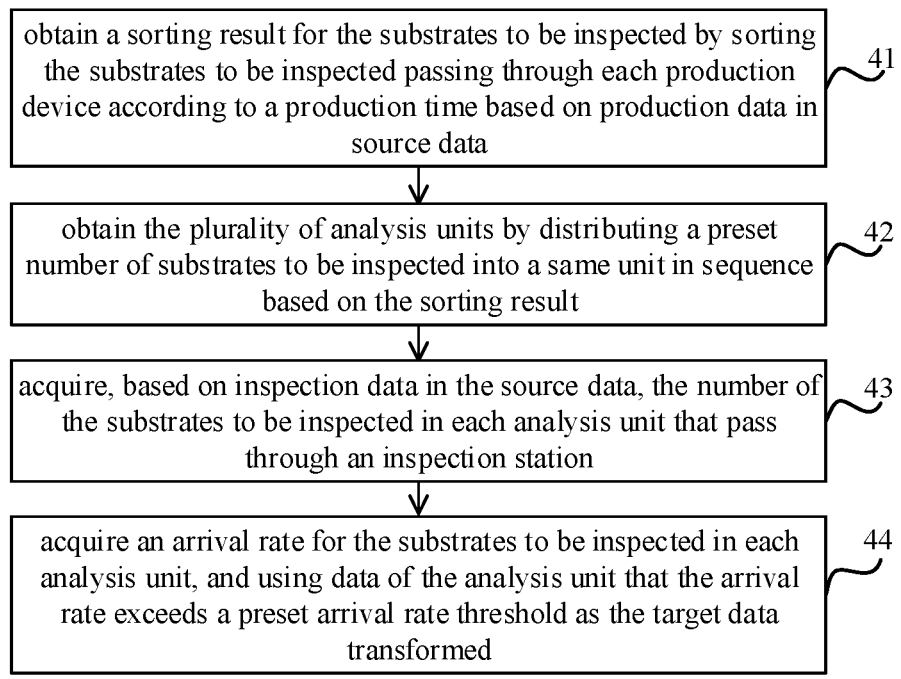
FIG. 4 is a flowchart illustrating acquisition of target data according to an exemplary embodiment.

Referring to FIG. 4, the data transformation apparatus 200 transforms the source data into the target data, which may include step 41 to step 44.

At step 41, the data transformation apparatus 200 may acquire the production data in the source data, where the production data includes production time for the substrate to be inspected to enter the production device. Then, the data transformation apparatus 200 may sort the substrates to be inspected that pass through each production device according to the production time in the production data, to obtain a sorting result for the substrates to be inspected. The production time is the moment when the substrate to be inspected enters each production device for production, that is, the production time of the substrate to be inspected is a collection of a plurality of moments corresponding to the production devices one-to-one.

For example, in this step, the data transformation apparatus 200 may read the production data in the source data, such as the production devices EQP (e.g., CVD devices), parallel process sections MACHINE in the same device (e.g., cleansing units in the CVD device), and parallel process units UNIT in the same device (e.g., specific process chambers in the CVD device), and sort the substrates to be inspected according to the time when the substrates to be inspected enter and/or leave each production device (EQP, MACHINE, or UNIT), that is, the order of the substrate to be inspected earlier in the production time may precede the order of the substrate to be inspected later in the production time.

At step 42, the data transformation apparatus 200 may distribute a preset number (e.g., K) of substrates to be inspected into the same unit in sequence based on the above sorting result to obtain the plurality of analysis units. A value of K is a positive integer greater than or equal to 2. It may be understood that the larger the number of the substrates to be inspected in each analysis unit, the more accurate the position data of repeated defect points may be acquired subsequently. The value of K may be selected according to specific scenarios, for example, according to a production speed during the production process. In an example, the value of K is 28. In this step, the K substrates to be inspected may be distributed into one analysis unit, such that the data of one analysis unit may be processed at a time during the subsequent processing, which can reduce the amount of data processing each time, and is conducive to timely detection of the time when the repeated defect points appear.

At step 43, the data transformation apparatus 200 may acquire, based on the inspection data in the source data, the number M of the substrates to be inspected in each analysis unit that pass through the inspection station. In practical applications, after passing through the production device, the substrate to be inspected may be defective and be removed from the process flow without arriving at the inspection station corresponding to the production device, such that the number M of the substrates to be inspected from the same analysis unit that arrive at the inspection device may be less than or equal to K. The purpose of acquiring the number M in this step is: first, to determine the valid substrates to be inspected in the analysis unit and to obtain the corresponding source data; second, to determine whether to process the data of the analysis unit according to an arrival rate, see step 44. It may be understood that, the number M of the substrates to be inspected in step 43 may be counted after obtaining all data of each analysis unit, or may be obtained by acquiring the number of the substrates to be inspected in each analysis unit in real time. The method of acquiring the number M may be selected according to specific scenarios, which is not limited herein.

At step 44, the data transformation apparatus 200 may acquire an arrival rate $$\text{Batchn\_R} = \frac{M}{K}, (M \leq K)$$

of the substrates to be inspected in each analysis unit, and use data of the analysis unit that the arrival rate exceeds a preset arrival rate threshold as the target data transformed. Then, the data transformation apparatus 200 may store the above target data in the KUDU database of the data processing apparatus. In practical applications, data of the analysis unit that the arrival rate is less than the above arrival rate threshold may also be stored in the above KUDU database, so as to ensure the integrity and traceability of the inspection data.

Based on the above, the target data in this embodiment may include, but is not limited to, the arrival rate, the identification code of the production device, the identification code of the substrate to be inspected, a serial number of the analysis unit, the identification code of the process station, and the time for the substrate to be inspected to leave the process station, as well as the inspection data of each analysis unit, which may be set according to specific scenarios and are not limited herein.

In this step, the arrival rate for the substrates to be inspected in each analysis unit may be used for the following purposes. First, it is determined, according to the arrival rate, whether to process the data of the analysis unit, that is, the target data, so as to obtain the analysis unit that may characterize the repeated defects, and achieve the effect of screening the analysis units. Secondly, an arrival rate threshold may be set, and when the arrival rate exceeds the above arrival rate threshold, the analysis unit may be used as the target data for the processing of the repeated defects, instead of waiting for the source data (e.g., the inspection data) of all the substrates to be inspected before data transformation or data upload, which is conducive to improving the efficiency of data upload, and in turn conducive to advancing time to process the target data of the analysis unit to facilitate timely detection of defects. Alternatively, when the arrival rate exceeds the above arrival rate threshold, the analysis unit may be used as the target data for the processing of the repeated defects. At this time, the target data may be cached locally, and processed after all the data of all substrates to be inspected in the analysis unit is available. The data of the analysis unit that the arrival rate is less than the above arrival rate threshold may be discarded, which is beneficial to reduce the amount of stored data and improve the use efficiency of storage space.

In this embodiment, the system may include the data processing apparatus 300 that may communicate with the data transformation apparatus 200 to acquire the target data described above.

At step 22, inspection data of a plurality of substrates to be inspected that contain defect points is acquired from each of the analysis units.

In this embodiment, the data processing apparatus 300 in the system may use the Spark computing engine to perform data processing on the target data, and achieve fast data analysis and calculation with the ability of parallel in-memory computing of the Spark. The data processing apparatus may acquire, from each analysis unit, the inspection data of the plurality of substrates to be inspected that contain the defect points. It may be understood that the data processing apparatus 300 may determine an identification code of the inspection device based on the production device and the metadata in the target data, and then extract the inspection data including the identification code of the substrate to be inspected from the inspection data corresponding to the identification code of the inspection device, to obtain the inspection data of the plurality of substrates to be inspected that contain the defect points. Alternatively, the data processing apparatus 300 may extract, directly from the target data, the inspection data of the plurality of substrates to be inspected that contain the defect points.

At step 23, the defect points in the plurality of substrates to be inspected are superimposed to obtain a data set of the defect points.

In this embodiment, the data processing apparatus 300 may directly superimpose the defect points in the plurality of substrates to be inspected to obtain the data set of the defect points. Alternatively, the data processing apparatus 300 may acquire an arrival rate for each analysis unit from the target data, and compare that arrival rate with a preset arrival rate threshold. When the arrival rate is greater than or equal to the above arrival rate threshold, it is determined to process the analysis unit. At this time, the data processing apparatus 300 may superimpose the defect points in the plurality of substrates to be inspected to obtain a data set of the defect points for each analysis unit.

A coordinate position of the defect point contained in the substrate to be inspected on the substrate to be inspected is generated by performing a defect point inspection on the substrate to be inspected at the inspection station. For example, after the substrate to be inspected enters the inspection station, an image sensor in the inspection station captures an image of the substrate to be inspected, identifies the defect point on the image by using a preset defect point inspection model, and aggregates and stores, in the distributed storage apparatus, the defect point in each substrate to be inspected.

The superimposition process may be described as follows. For each analysis unit, the data processing apparatus 300 may sequentially place or map the defect points of each substrate to be inspected into the same coordinate system, thereby forming a two-dimensional map of the defect points, which may be equivalent to the data set of the defect points $D(p_1, p_2, \ldots, p_n)$ corresponding to the analysis unit, where pi (i is 1~n) represents coordinate data of one of the defect points in the data set of the defect points, including horizontal coordinates, vertical coordinates, and the identification code of the substrate to be inspected.

At step 24, a clustering calculation is performed on the data set of the defect points to obtain a first cluster set of the defect points.

In this embodiment, the data processing apparatus 300, by superimposing the defect points of the plurality of substrates to be inspected, may obtain the defect points of different substrates to be inspected that are repeatedly defective in the same area of the above coordinate system, that is, obtain a cluster set of the defect points, so as to achieve the effect of timely detection of the production device with repeated defects, which is beneficial to improve the production yield of the substrates to be inspected.

In this embodiment, the repeated defect points are defined as follows. If the number of the defect points within an area formed by taking a point $p_i(p_i \in D)$ as a reference point and r (which is adjustable) as a distance threshold exceeds a number threshold, the defect points within the above area are determined as the repeated defect points.

Figure 5:
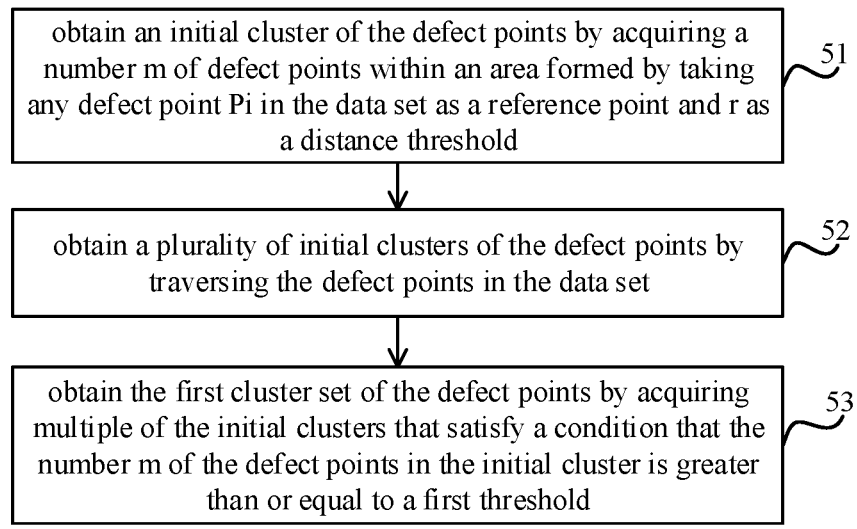
FIG. 5 is a flowchart illustrating acquisition of a first cluster set of defect points according to an exemplary embodiment.

In this embodiment, referring to FIG. 5, obtaining the first cluster set of the defect points includes step 51 to step 53. At step 51, an initial cluster of the defect points is obtained by acquiring the number m of the defect points within an area formed by taking any defect point $p_i$ in the data set $D(p_1, p_2, \ldots, p_n)$ as a reference point and r (which is adjustable) as a distance threshold.

At step 52, a plurality of initial clusters of the defect points are obtained by traversing the defect points in the data set $D(p_1, p_2, \ldots, p_n)$.

At step 53, the first cluster set of the defect points is obtained by acquiring multiple of the initial clusters that satisfy a condition that the number m of the defect points in the initial cluster is greater than or equal to a first threshold.

For example, a circle $C_i$ is obtained by taking the point $p_i$ ($p_i \in D$) as a center of the circle and the distance threshold r (which is adjustable) as a radius, and the number m of the substrates to be inspected to which the defect points included in C belong is calculated. If m≥$m_i$ (such as 3 to 5, which is adjustable), then the repeated defect points are clustered at the point $p_i$, and at this time, the defect points in the circle corresponding to the point $p_i$ may be used as a point cluster.

After each defect point is used as a center of a circle, that is, after the defect points are traversed, the data processing apparatus 300 may acquire clusters of the defect points corresponding to each defect point in the data set of the defect points $D(p_1, p_2, \ldots, p_n)$, to obtain the first cluster set of the defect points $R=(R_1, R_2, \ldots, R_n)$.

That is, each cluster of the defect points in the first cluster set is a collection of defect points covered by a circle formed by taking each defect point $p_i$ as a center of the circle and a distance threshold r as a radius. The above distance threshold may be determined based on an alignment deviation for the substrates to be inspected in the analysis unit, and may be, for example, 3-10 pixels. The above alignment deviation is an offset of a point at the same position when the image sensor at the inspection station captures images of two substrates to be inspected, and is caused by a mechanical structure for moving the substrates to be inspected.

In an embodiment, considering that the number of the defect points is usually larger, that is, the data set of the defect points has a larger amount of data, resulting in a relatively large amount of subsequent calculation, a neighborhood search method may be used in the present disclosure to obtain the first cluster set of the defect points. For example, the neighborhood search method is implemented by the kd-tree algorithm, in which the number m of the defect points is searched for in the neighborhood of the point $p_i$ ($p_i \in D$) by taking the point $p_i$ as a reference point and r (which is adjustable) as a distance threshold to form a cluster of the defect points $R_i$. When the number m of the substrates to be inspected to which the defect points in $R_i$ belong is greater than or equal to $m_i$, the cluster of the defect points $R_i$ may be stored in the first cluster R. When all the defect points $p_i$ are traversed, the first cluster of the defect points may be obtained. By using the neighborhood search algorithm in this embodiment, it is possible to enable a quick search in the nearest neighborhood in the two-dimensional space with large-scale data, improve the data processing speed, and help improve the efficiency of defect inspection.

At step 25, alarm information for a device contact position corresponding to the first cluster set of the defect points is generated based on the first cluster set.

Figure 6:
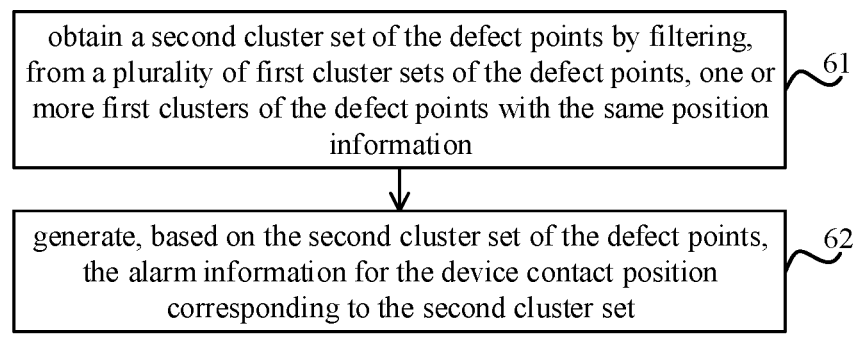
FIG. 6 is a flowchart illustrating generation of alarm information according to an exemplary embodiment.

In this embodiment, the data processing apparatus 300 may generate the alarm information for the device contact position corresponding to the first cluster set of the defect points based on the first cluster set, which includes step 61 and step 62 as shown in FIG. 6.

Figure 7:
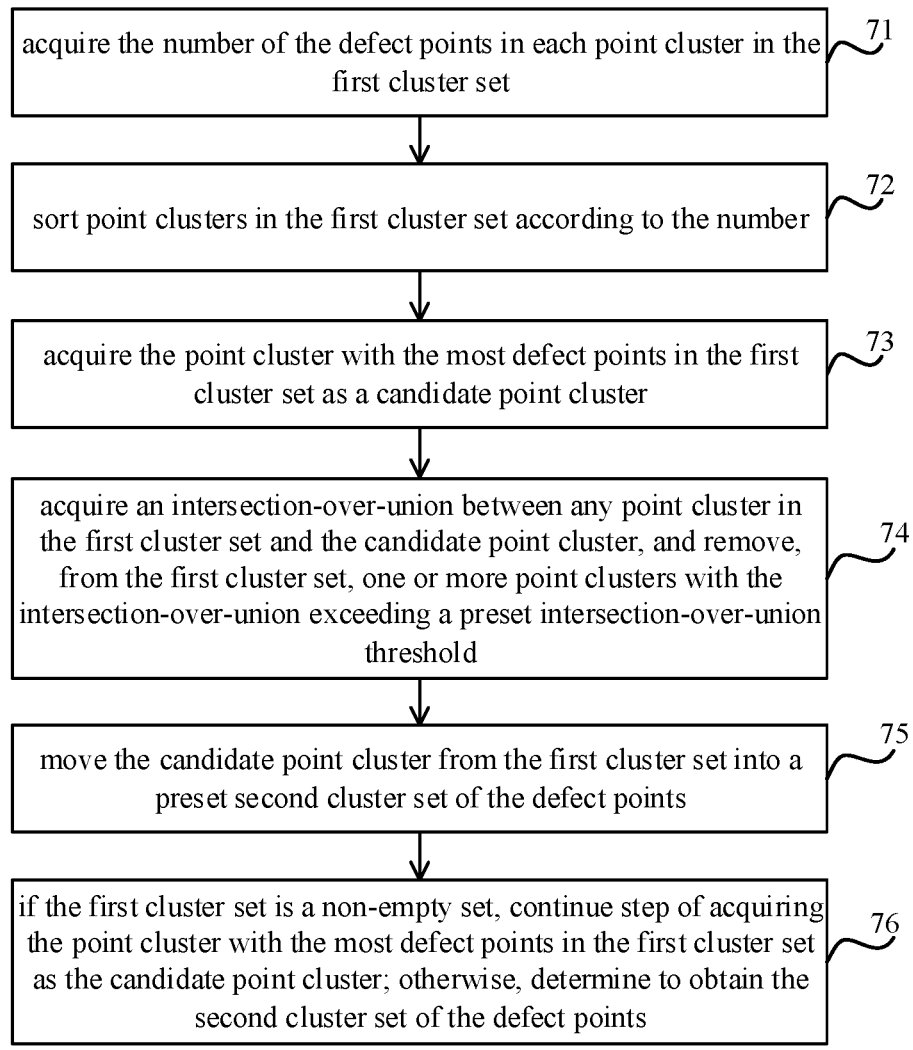
FIG. 7 is a flowchart illustrating filtering of repeated defect points from a first point cluster set according to an exemplary embodiment.

At step 61, the data processing apparatus 300 may obtain a second cluster set of the defect points by filtering, from a plurality of first cluster sets of the defect points, one or more first clusters of the defect points with the same position information. For example, the data processing apparatus 300 may filter, from the first cluster set of the defect points $R=(R_1, R_2, \ldots, R_n)$, the defect points with the same position information among different point clusters or the defect points that coincide with each other in the above two-dimensional map. For example, for the point cluster set R, there are repeated points ($p_l$, $p_{l+1}$, $p_{l+2}$) between point clusters $R_i=(p_l, p_{l+1}, p_{l+2}, p_{l+3}, \ldots)$ and $R_j=(\ldots, p_{l-1}, p_l, p_{l+1}, p_{l+2})$, where $R_i$, $R_j \in R$, and $p_l \in D$. In this way, by filtering the defect points with the same position information among different point clusters in this step, it is possible to eliminate repeated alarms for defects in the same area. Based on the above, the process of filtering the defect points with the same position information by the data processing apparatus 300 includes step 71 to step 76 as shown in FIG. 7.

At step 71, the data processing apparatus 300 may acquire the number of the defect points in each point cluster in the first cluster set of the defect points $R=(R_1, R_2, \ldots, R_n)$. It may be understood that in step 71, the number of the defect points in each point cluster may be acquired in real time, or the number of the defect points in each point cluster may be stored in the first cluster set as attribute data of each point cluster when acquisition of the first cluster set, and be read directly in step 71, such that the processing process can be reduced and the processing efficiency can be accelerated.

At step 72, the data processing apparatus 300 may sort point clusters in the first cluster set according to the number, for example, from largest to smallest.

At step 73, the data processing apparatus 300 may acquire the point cluster with the most defect points in the first cluster set as a candidate point cluster.

At step 74, the data processing apparatus 300 may acquire an intersection-over-union between any point cluster in the first cluster set and the candidate point cluster, and remove, from the first cluster set, one or more point clusters with the intersection-over-union exceeding a preset intersection-over-union threshold. For example, the intersection-over-union (IOU) T between the candidate point cluster $R_i$ and a point cluster $R_j$ is expressed as $$T = \frac{R_i \cap R_j}{R_i \cup R_j}, (i \neq j).$$

If T>=t (t∈[0,1]), the point cluster $R_j$ is removed from the first cluster set R. If T<t, the point cluster $R_j$ is retained.

At step 75, the data processing apparatus 300 may move the candidate point cluster from the first cluster set into a preset second cluster set of the defect points $\overline{R}$.

Figure 8A:
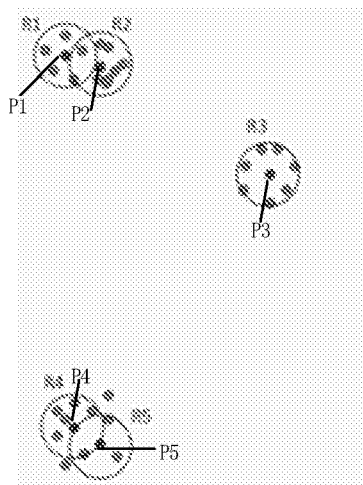
FIG. 8 (*a*) is a schematic diagram illustrating an effect that a first point cluster set includes five point clusters according to an exemplary embodiment.
Figure 8B:
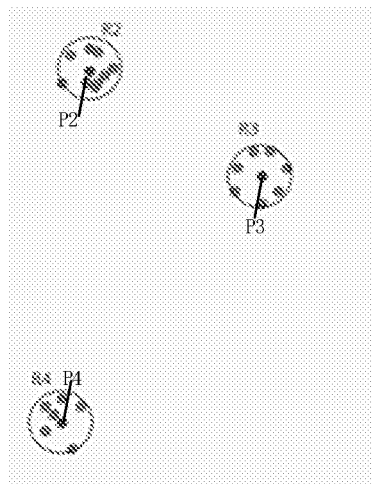

At step 76, if the first cluster set is a non-empty set, the data processing apparatus 300 may continue the step of acquiring the point cluster with the most defect points in the first cluster set as the candidate point cluster, that is, may traverse all the point clusters in the first cluster set by re-performing step 73 to step 76; otherwise, the data processing apparatus 300 may determine to obtain the second cluster set of the defect points $\overline{R}=(\overline{R_1}, \overline{R_2}, \ldots, \overline{R_n})$, the effect of which is shown in FIG. 8. FIG. 8 (a) illustrates an effect that the first cluster set of the defect points includes five point clusters, and FIG. 8 (b) illustrates an effect that the second cluster set of the defect points includes three point clusters. Compared FIG. 8 (b) with FIG. 8 (a), the point clusters R1 and R5 are filtered out.

At step 62, the data processing apparatus 300 may generate, based on the second cluster set of the defect points, the alarm information for the device contact position corresponding to the second cluster set.

In this embodiment, the data processing apparatus 300 may obtain point clusters with repeated defects upon obtaining the second cluster set of the defect points. Then, the data processing apparatus 300 may query the identification code of the substrate to be inspected based on the defect point in the point cluster, and obtain the identification code of a corresponding production device based on the production data of the substrate to be inspected to determine the abnormal production device. In other words, the method according to this embodiment can position the production device that causes the repeated defects. Moreover, the data processing apparatus 300 may determine the position information of the defect point based on the point cluster with repeated defects, as well as determine that a part of the production device is abnormal based on the above position information and the above production device, or obtain the device contact position corresponding to the data set of the defect points.

In this embodiment, after obtaining the device contact position, the data processing apparatus 300 may generate the alarm information for the device contact position corresponding to the cluster set of the defect points. The above device contact position may include at least one of: coordinates of the defect point, the identification code of the substrate to be inspected, or the identification code of the production device. Here, the alarm information may further include cause data of defects and time when defects appear, etc., which may be set according to specific scenarios and is not limited herein. Then, the data processing apparatus 300 may communicate to the user by specified means (such as SMS, email, and push message) to enable timely detection of problems and early warning to stop losses so as to avoid loss of yield.

For example, the user may log into the data processing system, find a BP Common Defect monitoring function in a function subscription interface, and click Subscribe. The user may enter the process station to be monitored, as well as calculation parameters (the number K of the substrates to be inspected (GLASS) distributed into an analysis unit (Batch), the arrival rate, a matching accuracy of the defect points, the number of defect GLASS, the intersection-over-union (IOU) threshold, and other key parameters). Finally, the user may select an abnormality alarm mode and confirm that the subscription takes effect. After the user subscribes to messages from the data processing system, the data processing apparatus may send the alarm information to the user by pushing a mobile portal message according to subscription configuration information when the alarm information is generated, so as to alert the user in time.

Figure 9:
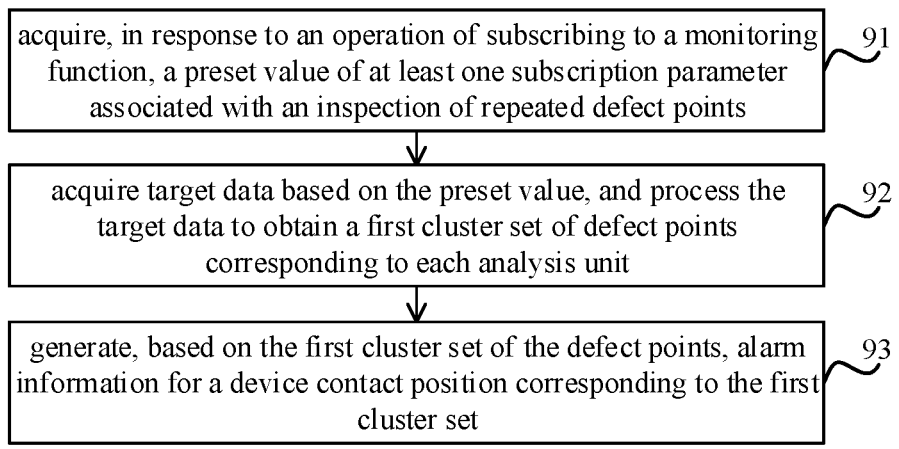
FIG. 9 is a flowchart illustrating a data processing method according to another exemplary embodiment.

FIG. 9 is a flowchart illustrating a data processing method according to an exemplary embodiment, which is applicable to the data processing system shown in FIG. 1. Referring to FIG. 9, a data processing method includes step 91 to step 93.

Figure 10:
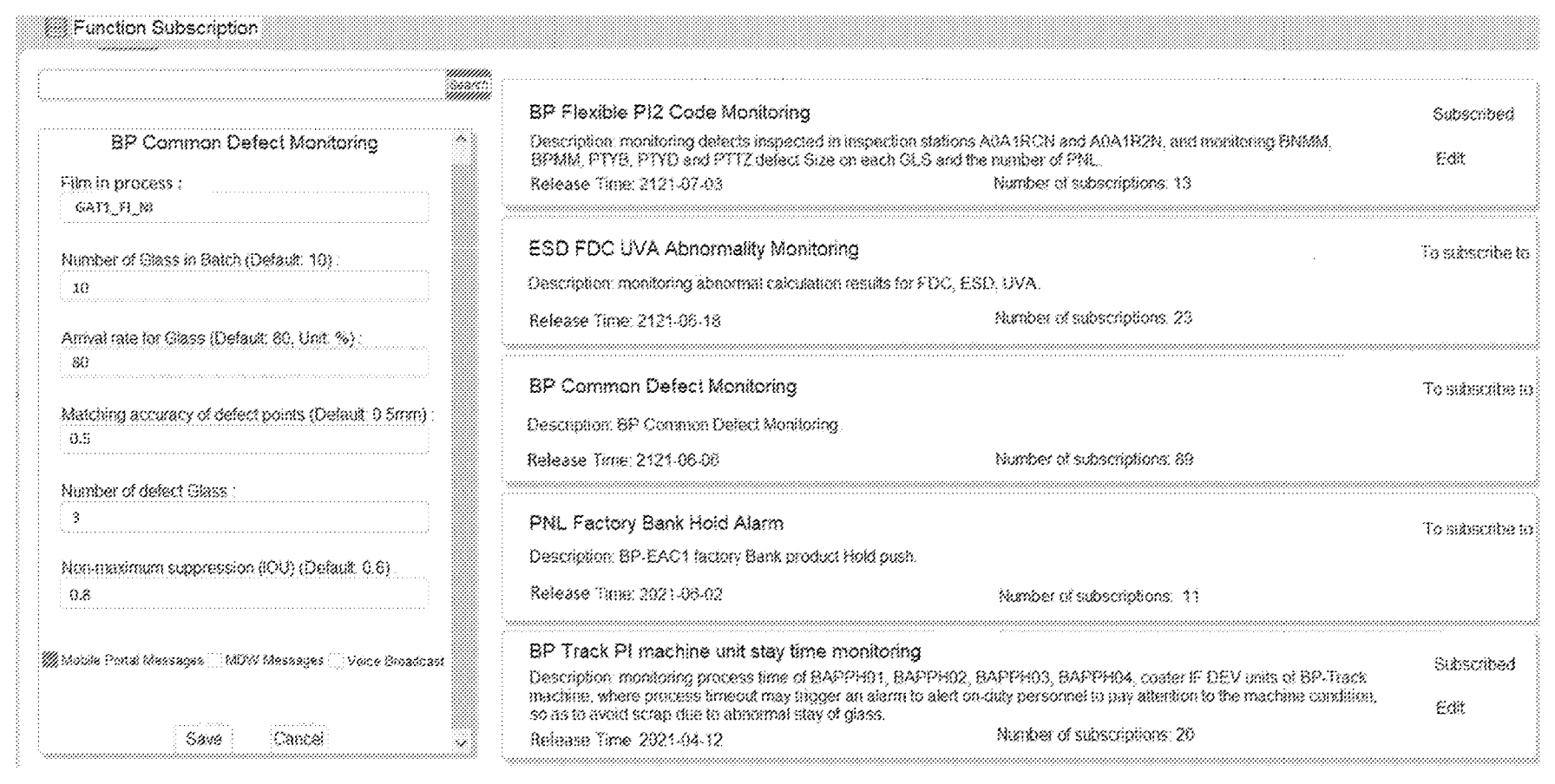

At step 91, in response to an operation of subscribing to a monitoring function, a preset value of at least one subscription parameter associated with an inspection of defect points is acquired. In this step, a display apparatus is included in the data processing system. The display apparatus may be a touch display, which may display the function subscription interface, the effect of which is shown in FIG. 10. After logging into the data processing system, the user may find Subscribe to a Monitoring Function (e.g., the BP Common Defect monitoring function) in the function subscription interface, and then click Subscribe. The user may enter, in the function subscription interface, the preset value of the at least one subscription parameter associated with an inspection of repeated defect points. For example, the user may enter the process station to be monitored, and the calculation parameters which may include the number K of the substrates to be inspected (GLASS) distributed into an analysis units (Batch), the arrival rate (e.g., 80%), the matching accuracy of the defect points (e.g., 0.5 mm), the number of defect GLASS (e.g., 3), the intersection-over-union (IOU) threshold (e.g., 0.8) and other key parameters, as well as the abnormality alarm mode (e.g., the mobile portal message), and may confirm that the subscription takes effect. In this way, the touch display may acquire the preset value of at least one of the above subscription parameters and send the same to the data processing apparatus.

At step 92, target data is acquired based on the preset value and the target data is processed to obtain a first cluster set of the defect points corresponding to each analysis unit. In this step, the data processing apparatus may acquire the cluster set of the defect points corresponding to each analysis unit according to the above preset value. For the detailed acquisition process, reference may be made to the embodiment shown in FIG. 2, which will not be repeated herein.

At step 93, alarm information for a device contact position corresponding to the first cluster set is generated based on the first cluster set of the defect points. In this step, the data processing apparatus may generate the alarm information, see step 25 for details. After generating the alarm information, the data processing apparatus may further send the alarm information to a subscriber by pushing the mobile portal message according to a preset alarm mode, so as to alert the user in time. In this example, the data processing apparatus may send the alarm information to the touch display, and the touch display may display the above alarm information, as shown in FIG. 11.

Based on the data processing method as described above, embodiments of the present disclosure provide a data processing system. Referring to FIG. 1, the data processing system includes a distributed storage apparatus 100, a data transformation apparatus 200, and a data processing apparatus 300.

The distributed storage apparatus is configured to store source data.

The data transformation apparatus includes one or more first processors, which are configured to transform the source data into target data, where the target data includes data from a plurality of analysis units.

The data processing apparatus includes one or more second processors, which are configured to: acquire, from each of the analysis units, inspection data of a plurality of substrates to be inspected that contain defect points; superimpose the defect points in the plurality of substrates to be inspected to obtain a data set of the defect points; perform a clustering calculation on the data set of the defect points to obtain a first cluster set of the defect points; and generate, based on the first cluster set of the defect points, alarm information for a device contact position corresponding to the first cluster set.

Optionally, the source data includes at least one of metadata, production data, or inspection data, the metadata represents an association between a process station and an inspection station, the production data represents production history data of each of the substrates to be inspected, and the inspection data includes data generated when the substrate to be inspected is inspected in the inspection station.

Optionally, the one or more second processors are further configured to:
  obtain a sorting result for the substrates to be inspected by sorting the substrates to be inspected passing through each production device according to a production time based on production data in source data;
  obtain the plurality of analysis units by distributing a preset number of the substrates to be inspected into a same unit in sequence based on the sorting result;
  acquire, based on inspection data in the source data, the number of the substrates to be inspected in each analysis unit that pass through an inspection station; and
  acquire an arrival rate for the substrates to be inspected in each analysis unit, and use data of the analysis unit that the arrival rate exceeds a preset arrival rate threshold as the target data transformed.

Optionally, when performing the clustering calculation on the data set of the defect points to obtain the first cluster set of the defect points, the one or more second processors are further configured to:
  obtain an initial cluster of the defect points by acquiring a number m of defect points within an area formed by taking any defect point Pi in the data set as a reference point and r as a distance threshold;
  obtain a plurality of initial clusters of the defect points by traversing the defect points in the data set; and
  obtain the first cluster set of the defect points by acquiring multiple of the initial clusters that satisfy a condition that the number m of the defect points in the initial cluster is greater than or equal to a first threshold.

Optionally, when generating, based on the first cluster set of the defect points, the alarm information for the device contact position corresponding to the first cluster set, the one or more second processors are further configured to:
  obtain a second cluster set of the defect points by filtering, from a plurality of first cluster sets of the defect points, one or more first clusters of the defect points with the same position information; and
  generate, based on the second cluster set of the defect points, the alarm information for the device contact position corresponding to the second cluster set.

Optionally, when filtering, from the plurality of first cluster sets of the defect points, the one or more first clusters of the defect points with the same position information, the one or more second processors are further configured to:
  for each of the first cluster sets of the defect points, acquire the number of the defect points in each point cluster in the first cluster set;
  sort point clusters in the first cluster set according to the number;
  acquire the point cluster with the most defect points in the first cluster set as a candidate point cluster;
  acquire an intersection-over-union between any point cluster in the first cluster set and the candidate point cluster, and remove, from the first cluster set, one or more point clusters with the intersection-over-union exceeding a preset intersection-over-union threshold;
  move the candidate point cluster from the first cluster set into a preset second cluster set of the defect points; and
  if the first cluster set is a non-empty set, continue step of acquiring the point cluster with the most defect points in the first cluster set as the candidate point cluster; otherwise, determine to obtain the second cluster set of the defect points.

Optionally, the one or more second processors are further configured to:
  control a corresponding production device according to the device contact position to allow the production device to perform a protective action.

Optionally, the device contact position includes at least one of: coordinates of the defect point, an identification code of the substrate to be inspected, or an identification code of a production device.

Optionally, the data processing system further includes a display apparatus, the display apparatus including at least one display screen, which is configured to display the alarm information.

It may be understood that the systems according to the embodiments of the present disclosure correspond to the methods described above, the details of which may be referred to in various embodiments of the methods and will not be repeated herein. In an exemplary embodiment, there is further provided a computer-readable storage medium, such as a memory including instructions, and an executable computer program may be executed by a processor. The readable storage medium may include ROM, random access memory (RAM), CD-ROM, magnetic tape, floppy disk, optical data storage device, and the like.

Other embodiments of the present disclosure may readily occur to those skilled in the art upon consideration of the specification and practice of the disclosure disclosed herein. This disclosure is intended to cover any modifications, uses, or adaptations that follow the general principles of this disclosure and include common general knowledge or commonly used technical means in the art that are not disclosed in this disclosure. The specification and embodiments are to be considered exemplary only, with the true scope and spirit of this disclosure being indicated by the following claims.

It should be understood that the present disclosure is not limited to the precise structures described above and illustrated in the accompanying drawings, and that various modifications and changes may be made without departing from the scope thereof. The scope of the present disclosure is limited only by the appended claims.

The invention claimed is:

1. A data processing method, comprising:
   acquiring target data;
   acquiring, from the target data, inspection data of a plurality of substrates to be inspected that contain defect points;
   superimposing the defect points in the plurality of substrates to be inspected to obtain a data set of the defect points;
   performing a clustering calculation on the data set of the defect points to obtain a first cluster set of the defect points;
   generating, based on the first cluster set of the defect points, alarm information for a device contact position corresponding to the first cluster set; and
   controlling a production device according to the device contact position to allow the production device to perform a protective action,
   wherein acquiring the target data comprises:
   reading production data in source data from a distributed storage apparatus, and obtaining a sorting result for the substrates to be inspected by sorting the substrates to be inspected passing through each production device according to a production time in the production data;
   obtaining a plurality of units by distributing a preset number of the substrates to be inspected into a same unit in sequence based on the sorting result;
   acquiring, based on inspection data in the source data, the number of the substrates to be inspected in each unit that pass through an inspection station; and
   acquiring an arrival rate for the substrates to be inspected in each unit, obtaining analysis data of at least one unit whose arrival rate exceeds a preset arrival rate threshold, and using the analysis data as the target data.

2. The data processing method according to claim 1, wherein performing the clustering calculation on the data set of the defect points to obtain the first cluster set of the defect points comprises:
   obtaining an initial cluster of the defect points by acquiring a number m of defect points within an area formed by taking any defect point Pi in the data set as a reference point and r as a distance threshold;
   obtaining a plurality of initial clusters of the defect points by traversing the defect points in the data set; and
   obtaining the first cluster set of the defect points by acquiring multiple of the initial clusters that satisfy a condition that the number m of the defect points in the initial cluster is greater than or equal to a first threshold.

3. The data processing method according to claim 2, wherein generating, based on the first cluster set of the defect points, the alarm information for the device contact position corresponding to the first cluster set, comprises:
   obtaining a second cluster set of the defect points by filtering, from a plurality of first cluster sets of the defect points, one or more first clusters of the defect points with the same position information; and
   generating, based on the second cluster set of the defect points, the alarm information for the device contact position corresponding to the second cluster set.

4. The data processing method according to claim 3, wherein filtering, from the plurality of first cluster sets of the defect points, the one or more first clusters of the defect points with the same position information, comprises:
   for each of the first cluster sets of the defect points,
   acquiring the number of the defect points in each point cluster in the first cluster set;
   sorting point clusters in the first cluster set according to the number;
   acquiring the point cluster with the most defect points in the first cluster set as a candidate point cluster;
   acquiring an intersection-over-union between any point cluster in the first cluster set and the candidate point cluster, and removing, from the first cluster set, one or more point clusters with the intersection-over-union exceeding a preset intersection-over-union threshold;
   moving the candidate point cluster from the first cluster set into a preset second cluster set of the defect points; and
   if the first cluster set is a non-empty set, continuing step of acquiring the point cluster with the most defect points in the first cluster set as the candidate point cluster; otherwise, determining to obtain the second cluster set of the defect points.

5. The data processing method according to claim 1, wherein the device contact position comprises at least one of: coordinates of the defect point, an identification code of the substrate to be inspected, or an identification code of the production device.

6. A non-transitory machine-readable storage medium, wherein when an executable computer program in the storage medium is executed by a processor, the method according to claim 1 is implemented.

7. A data processing method, comprising:
   acquiring, in response to an operation of subscribing to a monitoring function, a preset value of at least one subscription parameter associated with an inspection of defect points;
   acquiring target data based on the preset value, and processing the target data to obtain a first cluster set of the defect points;

generating, based on the first cluster set of the defect points, alarm information for a device contact position corresponding to the first cluster set; and controlling a production device according to the device contact position to allow the production device to perform a protective action, wherein acquiring the target data comprises:

reading production data in source data from a distributed storage apparatus, and obtaining a sorting result for the substrates to be inspected by sorting the substrates to be inspected passing through each production device according to a production time in the production data;

obtaining a plurality of units by distributing a preset number of the substrates to be inspected into a same unit in sequence based on the sorting result;

acquiring, based on inspection data in the source data, the number of the substrates to be inspected in each unit that pass through an inspection station; and acquiring an arrival rate for the substrates to be inspected in each unit, obtaining analysis data of at least one unit whose arrival rate exceeds a preset arrival rate threshold, and using the analysis data as the target data.

8. A non-transitory machine-readable storage medium, wherein when an executable computer program in the storage medium is executed by a processor, the method according to claim 7 is implemented.

9. The data processing method according to claim 7, wherein generating, based on the first cluster set of the defect points, the alarm information for the device contact position corresponding to the first cluster set, comprises:

obtaining a second cluster set of the defect points by filtering, from a plurality of first cluster sets of the defect points, one or more first clusters of the defect points with the same position information; and generating, based on the second cluster set of the defect points, the alarm information for the device contact position corresponding to the second cluster set.

10. A data processing system, comprising:

a distributed storage apparatus, a data extraction, transformation and loading ETL apparatus, and a data processing apparatus, the data extraction, transformation and loading ETL apparatus being communicatively connected to the distributed storage apparatus and the data processing apparatus, wherein the distributed storage apparatus is configured to store source data;

the data extraction, transformation and loading ETL apparatus comprises one or more first processors, which are configured to transform the source data into target data; and the data processing apparatus comprises one or more second processors, which are configured to: acquire, from the target data, inspection data of a plurality of substrates to be inspected that contain defect points; superimpose the defect points in the plurality of substrates to be inspected to obtain a data set of the defect points; perform a clustering calculation on the data set of the defect points to obtain a first cluster set of the defect points; generate, based on the first cluster set of the defect points, alarm information for a device contact position corresponding to the first cluster set; and control a production device according to the device contact position to allow the production device to perform a protective action, wherein the one or more first processors are further configured to:

read production data in the source data from the distributed storage apparatus, and obtain a sorting result for the substrates to be inspected by sorting the substrates to be inspected passing through each production device according to a production time in the production data;

obtain a plurality of units by distributing a preset number of the substrates to be inspected into a same unit in sequence based on the sorting result;

acquire, based on inspection data in the source data, the number of the substrates to be inspected in each unit that pass through an inspection station; and acquire an arrival rate for the substrates to be inspected in each unit, obtain analysis data of at least one unit whose arrival rate exceeds a preset arrival rate threshold, and use the analysis data as the target data.

11. The data processing system according to claim 10, wherein the source data comprises at least one of metadata, production data, or inspection data, the metadata represents an association between a process station and an inspection station, the production data represents production history data of each of the substrates to be inspected, and the inspection data comprises data generated when the substrate to be inspected is inspected in the inspection station.

12. The data processing system according to claim 10, wherein when performing the clustering calculation on the data set of the defect points to obtain the first cluster set of the defect points, the one or more second processors are further configured to:

obtain an initial cluster of the defect points by acquiring a number m of defect points within an area formed by taking any defect point Pi in the data set as a reference point and r as a distance threshold;

obtain a plurality of initial clusters of the defect points by traversing the defect points in the data set; and obtain the first cluster set of the defect points by acquiring multiple of the initial clusters that satisfy a condition that the number m of the defect points in the initial cluster is greater than or equal to a first threshold.

13. The data processing system according to claim 12, wherein when generating, based on the first cluster set of the defect points, the alarm information for the device contact position corresponding to the first cluster set, the one or more second processors are further configured to:

obtain a second cluster set of the defect points by filtering, from a plurality of first cluster sets of the defect points, one or more first clusters of the defect points with the same position information; and generate, based on the second cluster set of the defect points, the alarm information for the device contact position corresponding to the second cluster set.

14. The data processing system according to claim 13, wherein when filtering, from the plurality of first cluster sets of the defect points, the one or more first clusters of the defect points with the same position information, the one or more second processors are further configured to:

for each of the first cluster sets of the defect points, acquire the number of the defect points in each point cluster in the first cluster set;

sort point clusters in the first cluster set according to the number;

acquire the point cluster with the most defect points in the first cluster set as a candidate point cluster;

acquire an intersection-over-union between any point cluster in the first cluster set and the candidate point cluster, and remove, from the first cluster set, one or more point clusters with the intersection-over-union exceeding a preset intersection-over-union threshold;

move the candidate point cluster from the first cluster set into a preset second cluster set of the defect points; and if the first cluster set is a non-empty set, continue step of acquiring the point cluster with the most defect points in the first cluster set as the candidate point cluster; otherwise, determine to obtain the second cluster set of the defect points.

15. The data processing system according to claim 10, wherein the device contact position comprises at least one of: coordinates of the defect point, an identification code of the substrate to be inspected, or an identification code of the production device.

16. The data processing system according to claim 10, further comprising a display apparatus, the display apparatus comprising at least one display screen, which is configured to display the alarm information.

\* \* \* \* \*